United States Patent
Liang

(10) Patent No.: US 12,191,177 B2
(45) Date of Patent: Jan. 7, 2025

(54) STORAGE SYSTEM, QUERY SYSTEM AND STORAGE METHOD FOR RETICLES, AND COMPUTER DEVICE

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 727 days.

(21) Appl. No.: 17/446,052

(22) Filed: Aug. 26, 2021

(65) Prior Publication Data

US 2022/0044950 A1 Feb. 10, 2022

Related U.S. Application Data

(63) Continuation of application No. PCT/CN2021/100771, filed on Jun. 18, 2021.

(30) Foreign Application Priority Data

Aug. 5, 2020 (CN) .......................... 202010776756.0

(51) Int. Cl.
*H01L 21/67* (2006.01)
*H01L 21/027* (2006.01)
(Continued)

(52) U.S. Cl.
CPC .... *H01L 21/67259* (2013.01); *H01L 21/0274* (2013.01); *H01L 21/67359* (2013.01); *H01L 23/544* (2013.01); *H01L 21/3085* (2013.01)

(58) Field of Classification Search
CPC ......... H01L 21/67259; H01L 21/67359; H01L 21/0274; H01L 21/3085; H01L 23/544; H01L 21/67288
See application file for complete search history.

(56) References Cited

U.S. PATENT DOCUMENTS 6,930,018 B2 8/2005 Mehrad
2008/0127467 A1* 6/2008 Hirano .............. H01L 21/67265
29/25.01

(Continued)

FOREIGN PATENT DOCUMENTS

CN 202594134 U 12/2012
CN 103176371 A 6/2013
(Continued)

*Primary Examiner* — Thomas Randazzo
(74) *Attorney, Agent, or Firm* — Syncoda LLC; Feng Ma

(57) ABSTRACT

A storage system for reticles includes carrier devices, including reticle placing regions for placing the reticles; a storage device, storing a preset coordinate system and position information of the carrier devices in the preset coordinate system; detection devices, arranged in one-to-one correspondence with the carrier devices, where each detection device performs reticle detection on a respective carrier device, send first detection signal responsive to a reticle being placed in the reticle placing region, and send second detection signal responsive to a reticle being placed outside the reticle placing region, the detection devices are connected with the storage device, and the storage device is further configured to store reticle position information of the reticle in the preset coordinate system when receiving the first or second detection signal; and alarm devices, connected with the detection devices in one-to-one correspondence, where each alarm device implements alarm display when receiving the second detection signal.

18 Claims, 10 Drawing Sheets

(51) Int. Cl.
    *H01L 21/308*     (2006.01)
    *H01L 21/673*     (2006.01)
    *H01L 23/544*     (2006.01)

(56) References Cited

U.S. PATENT DOCUMENTS

| | | | |
|---|---|---|---|
| 2009/0053023 A1* | 2/2009 | Wakabayashi | H01L 21/681 414/222.13 |
| 2010/0172720 A1* | 7/2010 | Kondoh | H01L 21/67766 414/217 |
| 2011/0160900 A1* | 6/2011 | Morita | H01L 21/67276 700/228 |
| 2013/0180448 A1* | 7/2013 | Sakaue | H01L 21/68707 118/696 |
| 2013/0202388 A1* | 8/2013 | Hayashi | H01L 21/67288 414/222.02 |
| 2014/0176701 A1* | 6/2014 | Okuno | H01L 21/67742 348/125 |
| 2016/0260629 A1* | 9/2016 | He | H01L 21/681 |
| 2018/0240695 A1* | 8/2018 | Hayashi | G03F 7/70733 |
| 2019/0378734 A1* | 12/2019 | Ehrne | H01L 21/67288 |
| 2020/0058531 A1* | 2/2020 | Matsumoto | H01L 21/67373 |

FOREIGN PATENT DOCUMENTS

| | | | |
|---|---|---|---|
| CN | 110348549 A | 10/2019 | |
| CN | 110941145 A | 3/2020 | |
| DE | 102007049103 A1 | 4/2009 | |
| JP | H09148221 A | 6/1997 | |
| WO | 2009114193 A2 | 9/2009 | |

\* cited by examiner

US 12,191,177 B2

STORAGE SYSTEM, QUERY SYSTEM AND STORAGE METHOD FOR RETICLES, AND COMPUTER DEVICE

CROSS-REFERENCE TO RELATED APPLICATIONS

This is a continuation of International Application No. PCT/CN2021/100771 filed on Jun. 18, 2021, which claims priority to Chinese Patent Application No. 202010776756.0, filed on Aug. 5, 2020. The disclosures of these applications are hereby incorporated by reference in their entirety.

BACKGROUND

Photolithography process is an important step in a manufacturing process of semiconductor devices, and in the step, geometric pattern structures are formed on a photoresist layer through exposure and development, and then patterns on a reticle are transferred to a substrate through an etching process. In the manufacturing process of semiconductor devices, multiple different patterns need to be formed on the substrate, one pattern corresponds to one reticle, and thus in the semiconductor device manufacturing process, multiple different types of reticles with different models need to be used.

SUMMARY

The disclosure relates to a storage system, a query system and a storage method for reticles, a computer device and a computer readable storage medium.

A first aspect of the disclosure provides a storage system for storing reticles, which includes carrier devices, a storage device, detection devices and alarm devices. The carrier devices include reticle placing regions for placing the reticles. The storage device stores a preset coordinate system and position information of the carrier devices in the preset coordinate system. The detection devices are arranged in one-to-one correspondence with the carrier devices, where each of the detection devices is configured to perform reticle detection on a respective one of the carrier devices, send a first detection signal responsive to a reticle being placed in the reticle placing region of the carrier device, and send a second detection signal responsive to a reticle being placed outside the reticle placing region of the carrier device; the detection devices are connected with the storage device; and the storage device is further configured to store reticle position information of the reticle in the preset coordinate system when receiving the first detection signal or the second detection signal. The alarm devices are connected with the detection devices in one-to-one correspondence, where each of the alarm devices is configured to implement alarm display when receiving the second detection signal.

A second aspect of the disclosure provides a query system for reticles, which includes a server, an input device, a query device and an output device. The server is connected with a storage device of at least one storage system and configured to acquire coding information of the storage system and reticle position information stored in the storage device, and the storage system is the storage system for storing reticles, which includes reading devices. The input device is configured to input preset reticle number information. The query device is respectively connected with the server and the input device and configured to acquire the coding information of the corresponding storage system and the corresponding reticle position information according to the preset reticle number information. The output device is connected with the query device and configured to output the coding information corresponding to the preset reticle number information and the corresponding reticle position information.

A third aspect of the disclosure provides a storage method for storing reticles, which is used for the storage system for storing reticles including carrier devices, and includes the following operations. Position information of the carrier devices in a preset coordinate system is acquired. It is detected whether a reticle is placed on each carrier device. Responsive to the reticle being placed on the carrier device, reticle position information of the reticle in the preset coordinate system is stored. Responsive to the reticle being placed outside a reticle placing region on the carrier device, alarm display is carried out.

The details of one or more embodiments of the disclosure are set forth in the drawings and description below. Other features and advantages of the disclosure will be apparent from the specification, the drawings, and the claims.

BRIEF DESCRIPTION OF THE DRAWINGS

In order to describe the technical solutions in the embodiments of the disclosure or the relevant art more clearly, the drawings required to be used in descriptions about the embodiments or the relevant art will be simply introduced below, obviously, the drawings described below are only some embodiments of the disclosure, and other drawings may further be obtained by those skill in the art according to the drawings without creative work.

DETAILED DESCRIPTION

Figure 1:
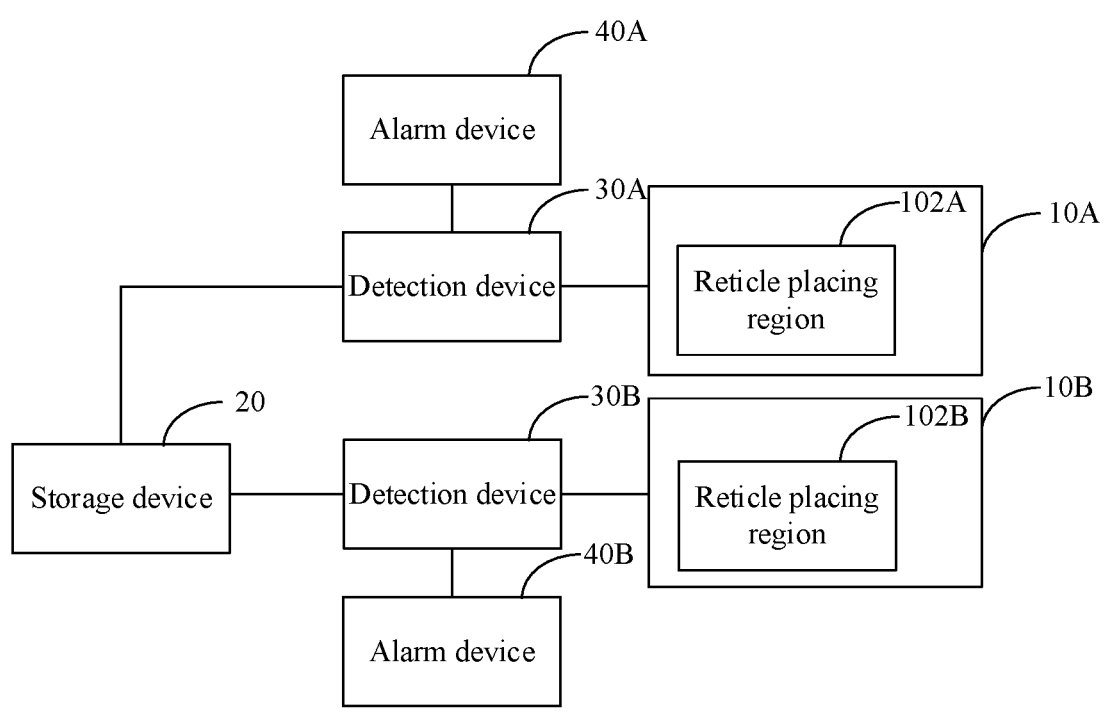
FIG. 1 is a structural schematic diagram of a storage system for storing reticles according to a first embodiment of the disclosure.

Reticles (also referred to as photomasks) used in semiconductor device production are not provided with a special storage box, and at present, some reticles which are not used temporarily are stored mainly by relying on a reticle tree. When the reticles are placed on the reticle tree, if the reticles are not placed in place, the reticles have the risk of falling off, so that semiconductor device production is interrupted, and great economic loss is brought.

In order to facilitate an understanding of the disclosure, a more complete description of the disclosure will now be made with reference to the associated drawings. Embodiments of the disclosure are given in the drawings. However, the disclosure may be realized in many different forms and is not limited to the embodiments described herein. Rather, the embodiments are provided so that a more thorough and complete understanding of the content of the disclosure is provided.

Unless defined otherwise, all technical and scientific terms used herein have the same meaning as commonly understood by those skilled in the art to which this disclosure belongs. The terms used in the specification of the disclosure herein are for the purpose of describing the specific embodiments only and are not intended to be limiting of the disclosure.

It is to be understood that, although the terms "first," "second," and the like may be used herein to describe various elements, these elements should not be limited by these terms. These terms are only used to distinguish one element from another.

It is to be noted that when an element is referred to as being "connected" to another element, it may be directly connected to the other element or a medium element may also be present. In addition, "connection" in the following embodiments should be understood as "electrical connection", "communicative connection", or the like if there is a transfer of electrical signals or data between the connected objects.

As used herein, the singular forms "a", "an" and "the" may include the plural forms as well, unless the context clearly indicates otherwise. It should be further understood that the terms "include/comprise" or "have" or the like, specify the presence of stated features, integers, steps, operations, components, parts, or groups thereof, but do not preclude the presence or addition of the possibility of one or more other features, integers, steps, operations, components, parts, or groups thereof. Meanwhile, the term "and/or" used in the specification includes any and all combinations of associated listed items.

In an embodiment, a storage system for storing reticles is provided, which includes carrier devices, a storage device, detection devices and alarm devices.

The carrier devices include reticle placing regions for placing the reticles.

The storage device stores a preset coordinate system and position information of the carrier devices in the preset coordinate system.

The detection devices are arranged in one-to-one correspondence with the carrier devices, where each of the detection devices is configured to perform reticle detection on a respective one of the carrier devices, send a first detection signal responsive to a reticle being placed in the reticle placing region on the carrier device, and send a second detection signal responsive to a reticle being placed outside the reticle placing region of the carrier device; the detection devices are connected with the storage device; and the storage device is further configured to store reticle position information of the reticle in the preset coordinate system when receiving the first detection signal or the second detection signal.

The alarm devices are connected with the detection devices in one-to-one correspondence, where each of the alarm devices is configured to implement alarm display when receiving the second detection signal.

As shown in FIG. 1, for example, the storage system for storing reticles includes two carrier devices 10A and 10B. The carrier device 10A includes a reticle placing region 102A for placing a reticle, the detection device 30A is arranged corresponding to the carrier device 10A, and the alarm device 40A is arranged corresponding to the detection device 30A. The detection device 30A is configured to perform reticle detection on the carrier device 10A, send a first detection signal responsive to a reticle being placed in the reticle placing region 102A on the carrier device 10A, and send a second detection signal responsive to a reticle being placed outside the reticle placing region 102A on the carrier device 10A. When the alarm device 40A receives the second detection signal sent by the detection device 10A, the alarm device 40A carries out alarm display to prompt a user that the reticle is not placed in the reticle placing region 102A of the carrier device 10A and the placing position of the reticle on the carrier device 10A needs to be adjusted, so that the risk that the reticle falls and is damaged is reduced. The carrier device 10B includes a reticle placing region 102B for placing a reticle, the detection device 30B is arranged corresponding to the carrier device 10B, and the alarm device 40B is arranged corresponding to the detection device 30B. The detection method is the same as the detection method for detecting the carrier device 10A, when the alarm device 40B receives the second detection signal sent by the detection device 10B, the alarm device 40B carries out alarm display to prompt a user that the reticle is not placed in the reticle placing region 102B of the carrier device 10B and the placing position of the reticle on the carrier device 10B needs to be adjusted, so that the risk that the reticle falls and is damaged when the reticle is not placed in the reticle placing region 102B of the carrier device 10B is reduced, and the interruption of semiconductor device production caused by damage of the reticles is further avoided. The preset coordinate system, position information A of the carrier device 10A in the preset coordinate system and position information B of the carrier device 10B in the preset coordinate system are stored in the storage device 20 of the storage system. The storage device 20 is respectively connected with the detection device 30A and the detection device 30B, and when the detection device 30A and/or the detection device 30B send/sends a first detection signal and/or a second detection signal, namely the detection device 30A and/or the detection device 30B detect/detects that a reticle is placed on the carrier device 10A and/or the carrier device 10B, the storage device 20 stores reticle position information of the reticle in the preset coordinate system, namely, the position information of the carrier device 10A and/or the carrier device 10B where the reticle is located in the preset coordinate system. If the detection device 30A detects that the reticle is placed on the carrier device 10A and the detection device 30B detects that the reticle is not placed on the carrier device 10B, the storage device 20 stores the position information A of the carrier device 10A in the preset coordinate system as reticle position information.

In an embodiment, the alarm display includes red indication and/or buzzer alarm. In other embodiments, the alarm display may be other common display with a warning function, such as a sound and light alarm, which will not be illustrated one by one.

In an embodiment, the alarm devices implement alarm display when a time duration, in which the second detection signal is continuously received, is not less than first preset time duration. In practical application, the value of the first preset time duration may be set as required, such as 5 seconds and 10 seconds.

In an embodiment, each detection device includes at least two detection modules, the detection modules are arranged in edge areas of the reticle placing region, the detection device sends a first detection signal responsive to the reticle being placed on the carrier device and the detection modules corresponding to the carrier device all detecting the reticle; and the detection device sends a second detection signal responsive to the reticle being placed on the carrier device, at least one of the detection modules corresponding to the carrier device not detecting the reticle and at least one of the detection modules detecting the reticle In an embodiment, each detection device includes an even number of detection modules, and the detection modules are arranged diagonally on the edge areas of the reticle placing region.

In an embodiment, each detection device includes an even number of detection modules, and the detection modules are arranged at the edge areas of two opposite sides of the reticle placing region. In the application process, the positions of the detection modules at the edge areas of two opposite sides of the reticle placing region may be set according to actual needs, for example, symmetrical arrangement and the like.

In an embodiment, each detection device includes an odd number of detection modules, and one detection module is arranged at an edge area of the reticle placing region, which is away from a position where a user takes and places the reticle.

Figure 2:
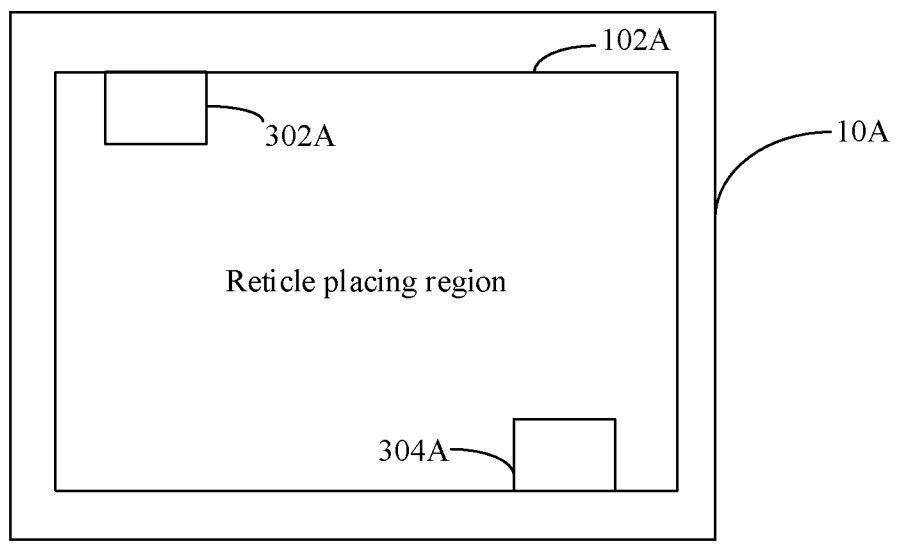
FIG. 2 is a schematic diagram showing positions of a detection device and a carrier device according to an embodiment of the disclosure.

As shown in FIG. 2, with the detection device 30A and the carrier device 10A as an example, it is assumed that the detection device 30A includes detection modules 302A and 304A, the detection module 302A and the detection module 304A are arranged diagonally on the edge areas of the reticle placing region 102A (namely, the detection module 302A and the detection module 304A are equidistant from respective edges of the reticle placing region 102A to which they are adjacent). The detection device 30A sends a first detection signal responsive to the reticle being placed on the carrier device 10A and the detection modules 302A and 304A all detecting the reticle; and the detection device 30A sends a second detection signal responsive to the reticle being placed on the carrier device 10A, any one of the detection modules 302A and 304A not detecting the reticle and the other one of the two detection modules detecting the reticle.

In an embodiment, the detection modules include pressure-sensitive sensors, and when the pressure-sensitive sensors detect that pressure signals for the edge areas are not smaller than a preset pressure signal, it is determined that the detection modules detect the reticles.

Figure 3:
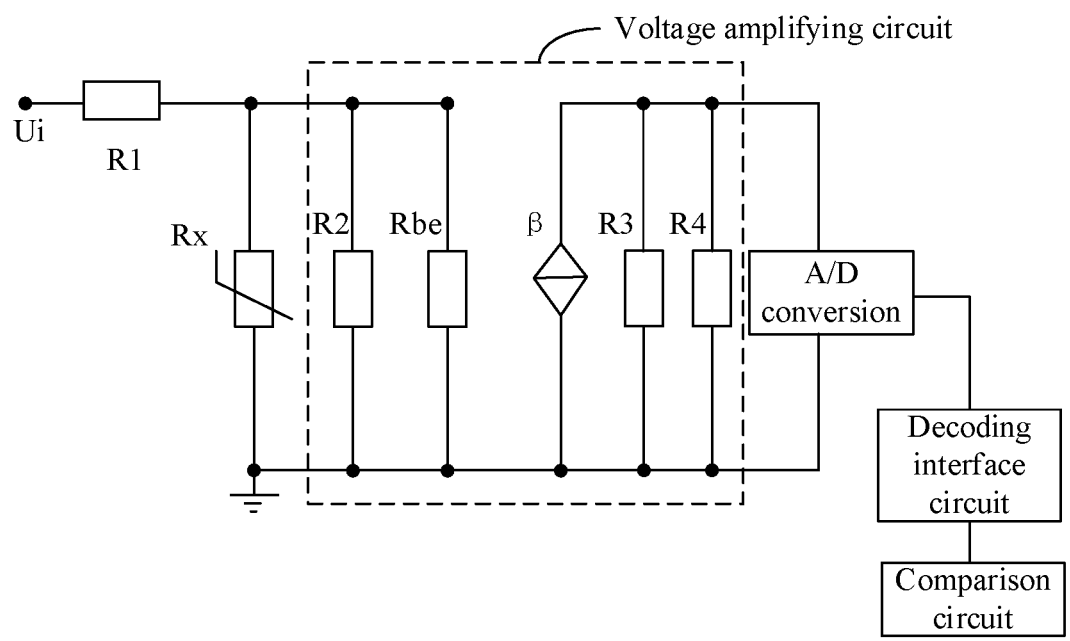
FIG. 3 is a schematic diagram showing the principle of detection through pressure-sensitive resistor according to an embodiment of the disclosure.

FIG. 3 is a schematic diagram showing the principle of detection through pressure-sensitive resistor according to an embodiment of the disclosure. Ui is input voltage, the resistor R1 is a fixed resistor, the resistor Rx is a pressure-sensitive resistor in each pressure-sensitive sensor, the resistors R1 and RX are connected in series, the output end of the pressure-sensitive resistor Rx is connected with the input end of a voltage amplifying circuit, and the voltage amplifying circuit, an A/D conversion module, a decoding interface circuit and a comparison circuit are sequentially connected in series. The voltage amplifying circuit includes a resistor R2, a transistor micro-change equivalent linear resistor Rbe, a constant current source beta, a resistor R3 and a resistor R4. When the reticle is in contact with the pressure-sensitive resistor Rx, according to the voltage division principle, voltage U0 across two ends of the pressure-sensitive resistor Rx is equal to Ui*Rx/(R1+Rx), when the pressure-sensitive resistor Rx is stressed differently, different voltages U0 are input into the voltage amplifying circuit, and after being amplified by the voltage amplifying circuit, the amplified voltage U1 is input into the A/D conversion module. For example, the voltage amplifying circuit amplifies voltages U0 across two ends of the pressure-sensitive resistor Rx by 150 times to obtain the voltage U1, the voltage U1 is analyzed and processed by the A/D conversion module and the decoding interface circuit, conversion data are input to the comparison circuit, the comparison circuit compares the conversion data with a preset value, and then the state of the reticle on the carrier device is determined. When it is determined that the reticle is not placed in reticle placing region, the detection device sends a second detection signal, and the alarm device implements alarm display to prompt an operator to adjust the position of the reticle on the carrier devices.

Figure 4:
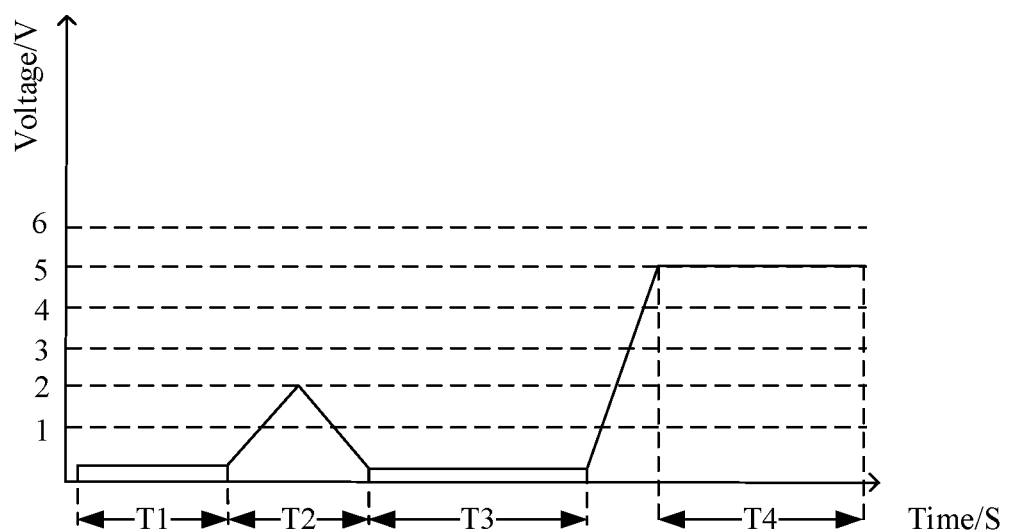
FIG. 4 is a schematic diagram illustrating a voltage output curve of a pressure-sensitive resistor according to an embodiment of the disclosure.

It is assumed that the detection modules 302A and 304A are both pressure-sensitive sensors, the detection module 302A includes a first pressure-sensitive resistor, and the detection module 304A includes a second pressure-sensitive resistor; when voltage output of the first pressure-sensitive resistor in the detection module 302A or the second pressure-sensitive resistor in the detection module 304A fluctuates along with time (similar to a curve corresponding to T2 in FIG. 4), the output voltage of the first pressure-sensitive resistor or the second pressure-sensitive resistor is abnormal, it is indicated that the reticle is placed outside the reticle placing region 102A of the carrier device 10A, and the detection device 30A sends a second detection signal. When the voltage output of the first pressure-sensitive resistor in the detection module 302A and the voltage output of the second pressure-sensitive resistor in the detection module 304A do not change over time, and the output voltage approaches zero (similar to the curves corresponding to T1 and T3 in FIG. 4), it is indicated that no reticle is placed in the reticle placing region 102A. When the voltage output of the first pressure-sensitive resistor in the detection module 302A and the voltage output of the second pressure-sensitive resistor in the detection module 304A do not change over time, and the output voltage approaches a fixed value M (similar to the curve corresponding to T4 in FIG. 4), it is indicated the detection module 302A and the detection module 304A detect a reticle that is placed in the reticle placing region 102A, then the detection device 30A sends a first detection signal. M is a voltage value output by the pressure-sensitive resistor when the reticle is placed in the reticle placing region 102A.

In an embodiment, the detection devices are further configured to send a third detection signal responsive to detecting that no reticle is placed on a respective carrier device; and the storage device 20 is further configured to delete the reticle position information, which is same as the position information of the carrier device having no reticle placed thereon, when the third detection signal is received.

Taking the carrier device 10A as an example, after the detection device 30A detects that the reticle is placed on the carrier device 10A, the storage device 20 stores first reticle position information of the reticle, after the reticle on the carrier device 10A is taken out, the detection device 30A detects that the reticle is not placed on the carrier device 10A, and sends a third detection signal, and after receiving the third detection signal, the storage device 20 deletes the stored first reticle position information.

In an embodiment, barcode patterns are arranged on the reticles, the storage system further includes reading devices in one-to-one correspondence with the carrier devices, and the reading devices are connected with the storage device and configured to acquire reticle number information from respective barcode patterns; and the storage device is further configured to store the reticle position information and the reticle number information in one-to-one correspondence.

In an embodiment, the reading devices include barcode readers, and the barcode patterns include two-dimensional codes. In the process that the reticle is placed on the carrier device, the barcode reader scans the two-dimensional code on the reticle and then obtains the corresponding reticle number information, and the obtained reticle number information is sent to the storage device.

In an embodiment, the reading devices include image acquisition devices and image recognition devices, the barcode patterns are reticle number information, in the process that the reticle is placed on the carrier device, the image acquisition device (such as cameras) in the reading device acquires an image of the barcode pattern, and the image recognition device recognizes the image and then acquires the reticle number information in the image, and send the acquired reticle number information to the storage device.

In an embodiment, the storage device 20 is further configured to delete the reticle position information, which is same as the position information of the carrier device having no reticle placed thereon and the reticle number information stored corresponding to the reticle position information when the third detection signal is received.

Figure 5:
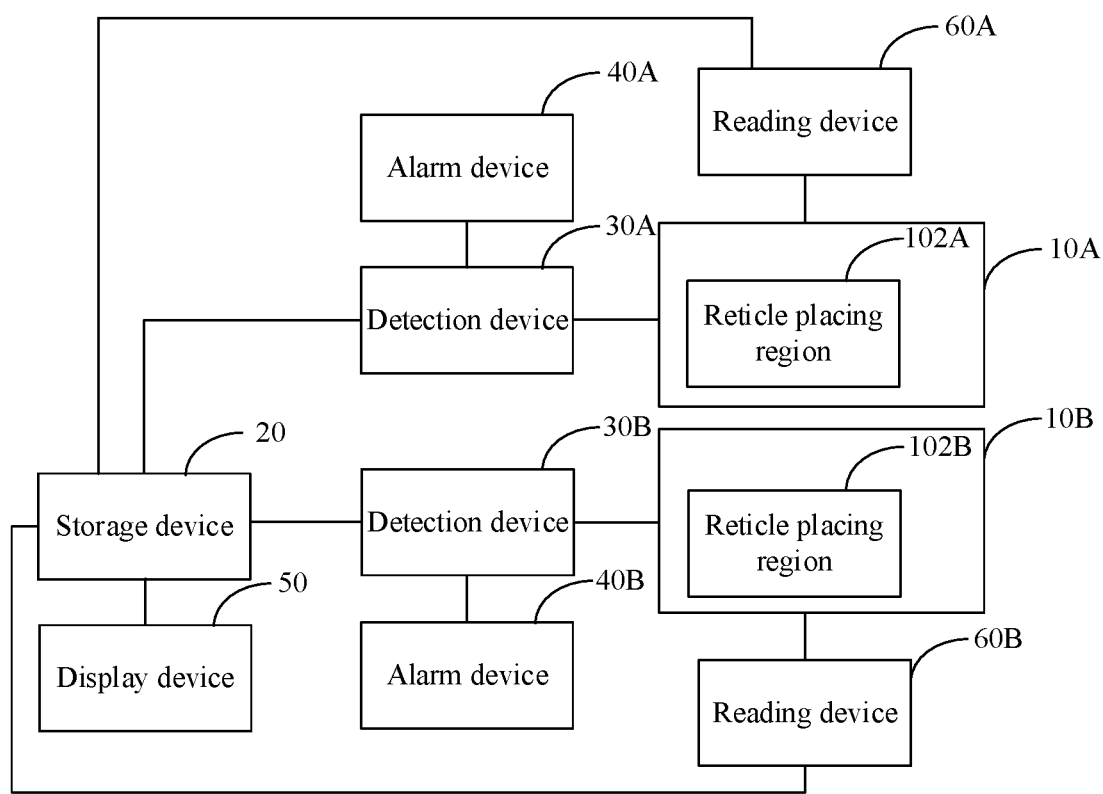
FIG. 5 is a structural schematic diagram of a storage system for storing reticles according to a second embodiment of the disclosure.

As shown in FIG. 5, the carrier device 10A is connected with the reading device 60A, the carrier device 10B is connected with the reading device 60B, when a first reticle and a second reticle are placed on the carrier devices 10A and 10B respectively, the reading device 60A reads reticle number information A1 of the first reticle, the reading device 60B reads reticle number information A2 of the second reticle, the storage device 20 correspondingly stores reticle position information B1 and reticle number information A1 of the first reticle, and correspondingly stores the reticle position information B2 and the reticle number information A2 of the second reticle.

In an embodiment, the storage device is further configured to store system time for obtaining the reticle position information and the reticle position information in one-to-one correspondence.

As shown in FIG. 5, in an embodiment, the storage system further includes a display device 50 connected to the storage device 20, the display device 50 is configured to establish a display coordinate system, where the display coordinate system is same as the preset coordinate system.

The display device 50 is further configured to display position information of each carrier device in the display coordinate system, implement first display responsive to the position information of the carrier device being same as the reticle position information, and implement second display responsive to the position information of the carrier device being different from the reticle position information.

After the display device 50 acquires the a preset coordinate system stored in the storage device 20, a display coordinate system the same as the preset coordinate system are established, then the position information of the carrier devices is displayed in the display coordinate system, when the reticles are placed on the carrier devices, the display device 50 carries out first display on the position information of the carrier devices, and when the reticles are not placed on the carrier devices, the display device 50 carries out second display on the position information of the carrier devices.

Figure 6:
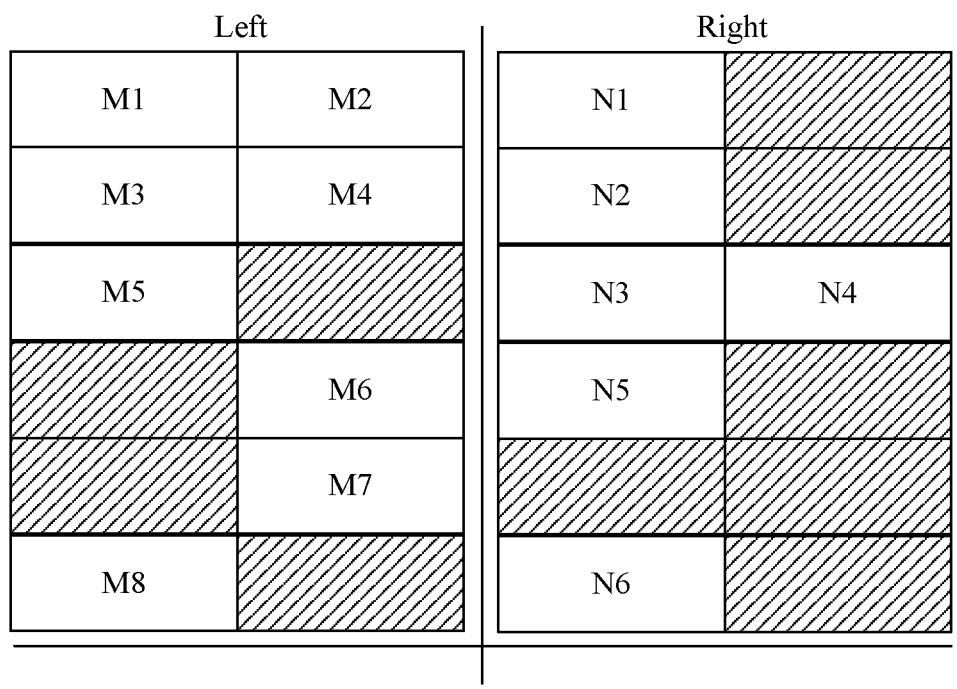
FIG. 6 is a display schematic diagram illustrating a display device displaying position information of carrier devices according to an embodiment of the disclosure.

In an embodiment, the first display is a display in green and the second display is a display in gray. In other embodiments, the first display and the second display are two things of the same type, or two things of different types, for example, different letters, different vocabularies, etc. As shown in FIG. 6, in an embodiment, the first display is a display of letters M (M1-Mx) and letters N (N1-Ny), where x, y are the numbers that make the first display, and the second display is a slash hatched area. Through different displays of the display device, a user may easily see which carrier devices in the storage system are not placed with reticles thereon.

In an embodiment, the first display is reticle number information corresponding to the reticle position information. The user may search the reticles stored in the storage system through the reticle number information displayed by the display device, the query process is simple, and operation errors caused by manually searching the reticles are avoided.

In an embodiment, the display device includes: an input device such as a mouse, a keypad, a touch panel and the like; a query device such as a processor of the display device and the like; and an output device such as an output circuit capable of outputting signals processed by the processor. The input device is configured to input query reticle number information required to be queried, the query device is connected with the input device and the storage device and is configured to obtain corresponding reticle position information according to the query reticle number information, and the output device is connected with the query device and is configure to output the reticle position information corresponding to the query reticle number information. The user may obtain the reticle position information of the reticle in the storage system by inputting the query reticle number information required to be queried through the input device, the query process is simple, and operation errors caused by searching the reticle according to the required reticle number information are avoided.

The storage system for storing reticles includes the carrier devices, which include the reticle placing regions for placing the reticles; the storage device, storing a preset coordinate system and position information of the carrier devices in the preset coordinate system; the detection devices, arranged in one-to-one correspondence with the carrier devices, where each of the detection devices is configured to perform reticle detection on a respective one of the carrier devices, send the first detection signal responsive to the reticle being placed in the reticle placing region on the carrier device, and send the second detection signal responsive to the reticle being placed outside the reticle placing region on the carrier devices, the detection devices are connected with the storage device, the storage device is further configured to store reticle position information of the reticle in the preset coordinate system when receiving the first detection signal or the second detection signal; and the alarm devices, connected with the detection devices in one-to-one correspondence, where each of the alarm devices is configured to implement alarm display when receiving the second detection signal. When each of the detection devices arranged in one-to-one correspondence with the carrier devices detects that a reticle is placed on a respective carrier device, the storage device stores reticle position information of the reticles in a preset coordinate system. When it is detected that reticle is outside the reticle placing region on the carrier device, each of the alarm devices connected with the detection devices in one-to-one correspondence implements alarm display. In this way, through the alarm devices connected with the detection devices in one-to-one correspondence, when the reticles on the carrier devices are not placed in respective reticle placing regions, alarm display is carried out; and therefore, the user is prompted to adjust the position of the reticle on the carrier devices until the reticle is placed in the reticle placing region on the carrier device. Therefore, the risk that the reticle falls and is damaged when the reticle is placed outside the reticle placing region on the carrier device is avoided, and economic loss caused by interruption of semiconductor device production due to reticle damage is further avoided.

Figure 7:
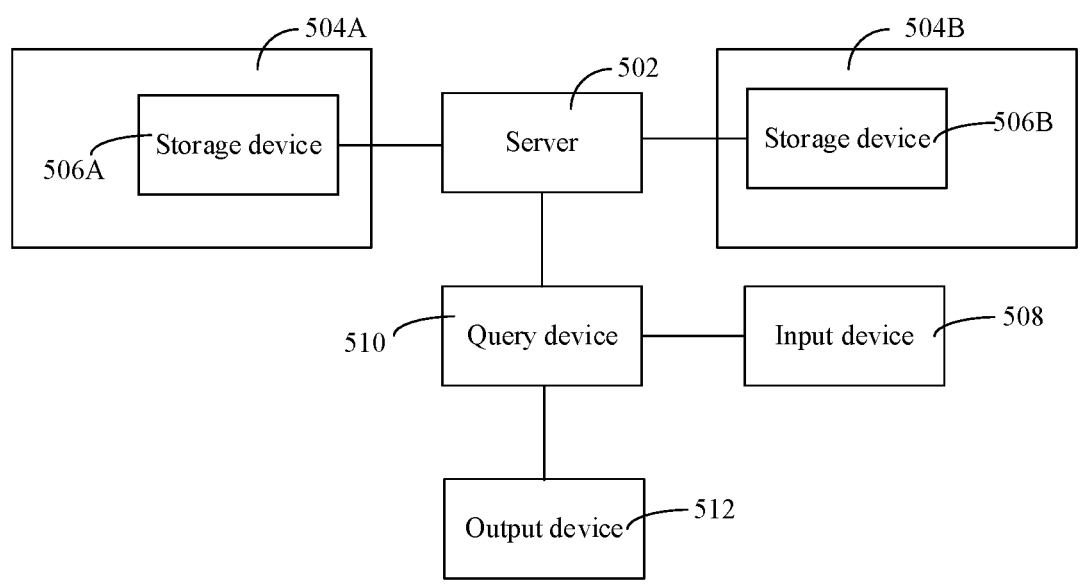
FIG. 7 is a structural schematic diagram of a query system for reticles according to an embodiment of the disclosure.

As shown in FIG. 7, in an embodiment, a query system for reticles is provided. The query system includes a server 502, an input device 508, a query device 510 and an output device 512.

The server 502 is connected with a storage device of at least one storage system and configured to acquire coding information of the storage system and reticle position information stored in the storage device, and the storage system is the storage system for storing reticles, which includes reading devices.

Referring to FIG. 7, the server 502 is connected with the storage device 506A of the storage system 504A and the storage device 506B of the storage system 504B, and is configured to acquire first coding information of the storage system 504A and second coding information of the storage system 504B, and the storage system is the storage system for storing reticles, which includes reading devices.

The input device 508 is configured to input preset reticle number information, that is, the input device 508 is configured to input preset reticle number information Z.

The query device 510 is respectively connected with the server 502 and the input device 508 and configured to acquire the coding information of the corresponding storage system and the corresponding reticle position information according to the preset reticle number information. If the reticle with the reticle number information Z is placed on the carrier device in the storage system 504A, the query device 510 obtains the first coding information of the storage system 504A and reticle position information Z' of the reticle with the reticle number information Z in the storage system 504A according to the preset reticle number information Z input by the input device 508.

The output device 512 is connected with the query device 510 and configured to output the coding information and reticle position information corresponding to the preset reticle number information. The output device 512 outputs the first coding information and corresponding reticle position information Z' of the storage system 504A corresponding to the preset reticle number information Z'.

In an embodiment, the output device 512 is further configured to output storage time corresponding to the reticle position information.

In one embodiment, the storage system includes a display device, the query system further includes a system display device connected with the output device and the query device, the system display device is configured to display coding information and reticle position information corresponding to the preset reticle number information, the server is further configured to acquire the position information of the carrier devices stored in the storage device, and the system display device is further configured to implement first display and second display of the display device of the storage system corresponding to the coding information.

The query system for reticles includes the server, the input device, the query device and the output device. The server is connected with a storage device of at least one storage system and configured to acquire coding information of the storage system and reticle position information stored in the storage device, and the storage system is the storage system for storing reticles, which includes reading devices. The input device is configured to input preset reticle number information. The query device is respectively connected with the server and the input device and configured to acquire the coding information of the corresponding storage system and the corresponding reticle position information according to the preset reticle number information. The output device is connected with the query device and configured to output the coding information and reticle position information corresponding to the preset reticle number information. The preset reticle number information of the reticle needing to be inquired is input through the input device, so that the coding information of the storage system where the reticle corresponding to the preset reticle number information is located and the reticle position information of the reticle in the storage system may be obtained from the output device. Through the query system provided by the disclosure, the coding information and reticle position information corresponding to the reticles stored in each storage system connected with the server of the query system may be rapidly obtained, the query time for querying the reticle stored in each storage system is shortened, and the query efficiency is improved.

Figure 8:
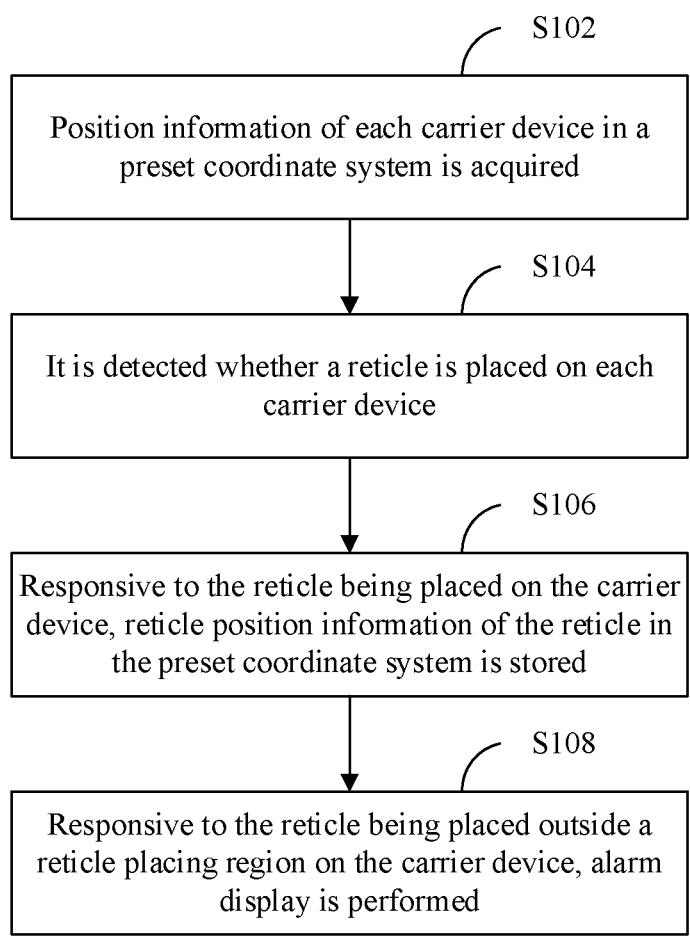
FIG. 8 is a flow diagram of a storage method for storing reticles according to an embodiment of the disclosure.

As shown in FIG. 8, in an embodiment, a storage method for storing reticles is provided, which is used for the storage system for storing reticles including carrier devices, and includes the following operations.

In S102, position information of each carrier device in a preset coordinate system is acquired.

In S104, it is detected whether a reticle is placed on each carrier device.

In S106, responsive to the reticle being placed on the carrier device, reticle position information of the reticle in the preset coordinate system is stored.

In S108, responsive to the reticle being placed outside a reticle placing region on the carrier device, alarm display is carried out.

In an embodiment, the step that whether a reticle is placed on each carrier device is detected includes the following sub-steps.

Pressure signals for edge areas of the reticle placing region are detected. If all the pressure signals are not smaller than a preset pressure signal, it is determined that the reticle is placed in the reticle placing region on the carrier device. If at least one pressure signal is not smaller than the preset pressure signal and at least one pressure signal is smaller than the preset pressure signal, it is determined that the reticle is placed outside the reticle placing region on the carrier device.

Figure 9:
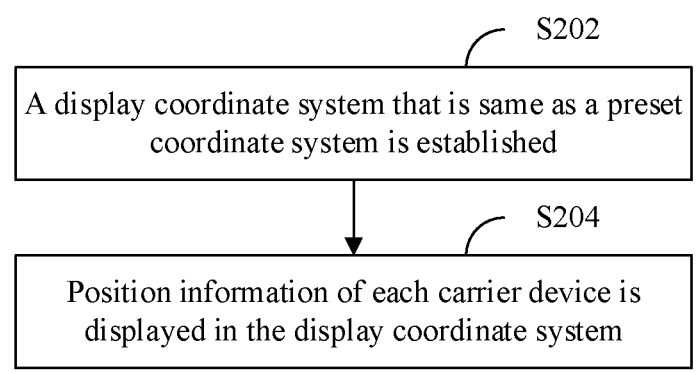
FIG. 9 is a flow diagram of a storage method for storing reticles according to another embodiment of the disclosure.

As shown in FIG. 9, in an embodiment, the method further includes the following operations.

In S202, a display coordinate system that is same as a preset coordinate system is established.

In S204, position information of each carrier device is displayed in the display coordinate system.

First display is carried out responsive to the position information of the carrier device being same as the reticle position information, and second display is carried out responsive to the position information of the carrier device being different from the reticle position information.

Figure 10:
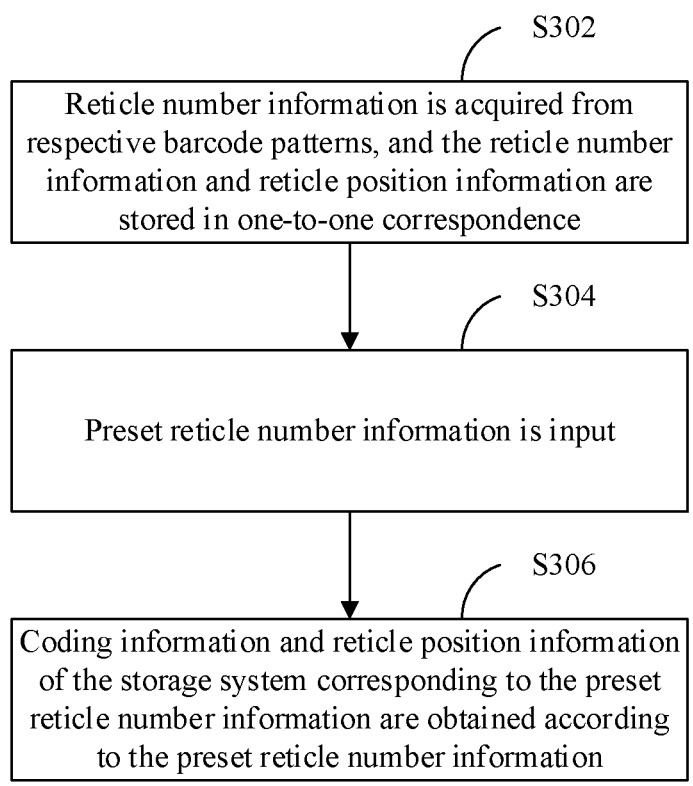
FIG. 10 is a flow diagram of a storage method for storing reticles according to still another embodiment of the disclosure.

As shown in FIG. 10, in an embodiment, barcode patterns are arranged on the reticles. The method further includes the following steps.

In S302, reticle number information is acquired from respective barcode patterns, and the reticle number information and the reticle position information are stored in one-to-one correspondence.

In S304, preset reticle number information is input.

In S306, coding information and reticle position information of the storage system corresponding to the preset reticle number information are obtained according to the preset reticle number information.

A computer device includes a memory and a processor. The memory stores a computer program. When the processor executes the program, the steps of the method in any of the embodiments of the disclosure are realized.

A computer readable storage medium, having stored thereon a computer program that, when executed by a processor, implements the steps of the method in any one of the embodiments of the disclosure.

The storage method for storing reticles, the computer device and the computer readable storage medium are used for the storage system for storing reticles including carrier devices. It is detected whether a reticle is placed on each carrier device. Responsive to the reticle being placed on the carrier device, reticle position information of the reticle in a preset coordinate system is stored. Responsive to the reticle being placed outside a reticle placing region on the carrier device, alarm display is carried out, therefore, when the reticle on the carrier device is not placed in the reticle placing region, alarm display is carried out, so that the user is prompted to adjust the position of the reticle on the carrier device until the reticle is placed in the reticle placing region on the carrier device. Therefore, the risk that the reticle falls and is damaged when the reticle is placed outside the reticle placing region on the carrier device is avoided, and economic loss caused by interruption of semiconductor device production due to reticle damage is further avoided.

Those of ordinary skill in the art will appreciate that implementing all or part of the processes in the methods described above may be accomplished by instructing associated hardware by a computer program, which may be stored in a non-volatile computer-readable storage medium, which, when executed, processes may be included as embodiments of the methods described above. Any reference to memory, storage, database, or other medium used in the various embodiments provided herein may include at least one of non-volatile memory and volatile memory. The non-volatile memory may include a Read-Only Memory (ROM), a magnetic tape, a floppy disk, a flash memory, or an optical memory, among others. The volatile memory may include Random Access Memory (RAM) or external cache memory. By way of illustration and not limitation, RAM may be in many forms, such as Static Random Access Memory (SRAM) or Dynamic Random Access Memory (DRAM), among others.

In the descriptions of the specification, the descriptions made with reference to terms "some embodiments", "other embodiments", ideal embodiments", or the like refer to that specific features, structures, materials or characteristics described in combination with the embodiment or the example are included in at least one embodiment or example of the application. In the specification, these terms are not always schematically expressed for the same embodiment or example.

The technical features of the above-described embodiments can be randomly combined, and not all possible combinations of the technical features in the above-described embodiments are described for simplicity of description, however, as long as the combinations of the technical features do not contradict each other, they should be considered to be within the scope of the description of the present specification.

The embodiments described above represent only several implementation modes of the disclosure, and the description thereof is specific and detailed, but should not be construed as limiting the scope of disclosure accordingly. It should be pointed out that those of ordinary skill in the art can also make some modifications and improvements without departing from the concept of the disclosure, and these modifications and improvements all fall within the scope of protection of the disclosure. Accordingly, the scope of the patent of the present application should be subject to the appended claims.

What is claimed is:

1. A storage system for storing reticles, the storage system comprising:
    carrier devices, comprising reticle placing regions for placing the reticles;
    a storage device, storing a preset coordinate system and position information of the carrier devices in the preset coordinate system;
    detection devices arranged in one-to-one correspondence with the carrier devices, wherein each of the detection devices is configured to perform reticle detection on a respective one of the carrier devices, send a first detection signal responsive to a reticle being placed in the reticle placing region of the carrier device, and send a second detection signal responsive to a reticle being placed outside the reticle placing region of the carrier device; the detection devices are connected with the storage device, and the storage device is further configured to store reticle position information of the reticle in the preset coordinate system when receiving the first detection signal or the second detection signal; and
    alarm devices connected with the detection devices in one-to-one correspondence, wherein each of the alarm devices is configured to implement alarm display when receiving the second detection signal.

2. The storage system of claim 1, wherein each of the detection devices is further configured to send a third detection signal responsive to detecting that no reticle is placed on a respective carrier device; and the storage device is further configured to delete the reticle position information, which is same as the position information of the carrier device having no reticle placed thereon, when the third detection signal is received.

3. The storage system of claim 1, wherein barcode patterns are arranged on the reticles, the storage system further includes reading devices in one-to-one correspondence with the carrier devices, and the reading devices are connected with the storage device and configured to acquire reticle number information from respective barcode patterns; and the storage device is further configured to store the reticle position information and the reticle number information in one-to-one correspondence.

4. The storage system of claim 1, wherein alarm display comprises red indication and/or buzzer alarm.

5. The storage system of claim 1, wherein each of the alarm devices is configured to implement alarm display when a time duration, in which the second detection signal is continuously received, is not less than first preset time duration.

6. The storage system of claim 1, wherein the storage system further comprises a display device connected to the storage device, the display device is configured to establish a display coordinate system, wherein the display coordinate system is same as the preset coordinate system; and
the display device is further configured to display position information of each carrier device in the display coordinate system, implement first display responsive to the position information of the carrier device being same as the reticle position information, and implement second display responsive to the position information of the carrier device being different from the reticle position information.

7. The storage system of claim 6, wherein the first display is a display in green and the second display is a display in gray.

8. The storage system of claim 6, wherein the display device comprising:
an input device, configured to input query reticle number information required to be queried;
a query device, connected with the input device and the storage device, and configured to obtain corresponding reticle position information according to the query reticle number information; and
an output device connected with the query device and configured to output reticle position information corresponding to the query reticle number information.

9. The storage system of claim 1, wherein each detection device comprises at least two detection modules, the detection modules are arranged in edge areas of the reticle placing region, the detection device sends a first detection signal responsive to the reticle being placed on the carrier device and the detection modules corresponding to the carrier device all detecting the reticle; and the detection device sends a second detection signal responsive to the reticle being placed on the carrier device, at least one of the detection modules corresponding to the carrier device not detecting the reticle and at least one of the detection modules detecting the reticle.

10. The storage system of claim 9, wherein the detection modules comprise pressure-sensitive sensors, and when the pressure-sensitive sensors detect that pressure signals for the edge areas are not smaller than a preset pressure signal, it is determined that the detection modules detect the reticles.

11. The storage system of claim 9, wherein each detection device comprises an even number of detection modules, and the detection modules are arranged diagonally on the edge areas of the reticle placing region.

12. The storage system of claim 9, wherein each detection device comprises an even number of detection modules, and the detection modules are arranged on the edge areas of two opposite sides of the reticle placing region.

13. The storage system of claim 9, wherein each detection device includes an odd number of detection modules, and one of the detection modules is arranged at the edge area of the reticle placing region, which is away from a position where a user takes and places the reticle.

14. A query system for reticles, comprising:
a server, connected with a storage device of at least one storage system and configured to acquire coding information of the storage system and reticle position information stored in the storage device;
an input device, configured to input preset reticle number information;
a query device respectively connected with the server and the input device and configured to acquire the reticle number information of the corresponding storage system and the corresponding reticle position information according to the preset reticle number information; and
an output device, connected with the query device and configured to output the coding information corresponding to the preset reticle number information and the corresponding reticle position information;
wherein the storage system comprises:
carrier devices, comprising reticle placing regions for placing the reticles;
a storage device, storing a preset coordinate system and position information of the carrier devices in the preset coordinate system;
detection devices arranged in one-to-one correspondence with the carrier devices, wherein each of the detection devices is configured to perform reticle detection on a respective one of the carrier devices, send a first detection signal responsive to a reticle being placed in the reticle placing region of the carrier device, and send a second detection signal responsive to a reticle being placed outside the reticle placing region of the carrier device; the detection devices are connected with the storage device, and the storage device is further configured to store reticle position information of the reticle in the preset coordinate system when receiving the first detection signal or the second detection signal; and
alarm devices connected with the detection devices in one-to-one correspondence, wherein each of the alarm devices is configured to implement alarm display when receiving the second detection signal.

15. A storage method for storing reticles, used for a storage system for storing reticles comprising carrier devices, the method comprising:
acquiring position information of each of the carrier devices in a preset coordinate system;
detecting whether a reticle is placed on each carrier device;
responsive to the reticle being placed on the carrier device, storing reticle position information of the reticle in the preset coordinate system; and
responsive to the reticle being placed outside a reticle placing region on the carrier device, implementing alarm display.

16. The storage method of claim 15, wherein said detecting whether the reticle is placed on each carrier device comprising:
detecting pressure signals for edge areas of the reticle placing region;
if all the pressure signals are not smaller than a preset pressure signal, determining that the reticle is placed in the reticle placing region on the carrier device; and
if at least one pressure signal is not smaller than the preset pressure signal and at least one pressure signal is smaller than the preset pressure signal, determining that the reticle is placed outside the reticle placing region on the carrier device.

17. The storage method of claim 15, further comprising:
establishing a display coordinate system that is same as a preset coordinate system;
displaying position information of each carrier device in the display coordinate system; and
implementing first display responsive to the position information of the carrier device being same as the reticle position information, and implementing second display responsive to the position information of the carrier device being different from the reticle position information.

18. The storage method of claim 15, wherein barcode patterns are arranged on the reticles, and the method further comprises:
- acquiring reticle number information from respective barcode patterns, and storing the reticle number information and the reticle position information in one-to-one correspondence;
- inputting preset reticle number information; and
- acquiring coding information and reticle position information of the storage system corresponding to the preset reticle number information according to the preset reticle number information.

\* \* \* \* \*